US012738305B2

(12) United States Patent
Guan et al.

(10) Patent No.: US 12,738,305 B2
(45) Date of Patent: Sep. 15, 2026

(54) INCREASED EFFICIENCY OF CURRENT INDUCED MOTION OF CHIRAL DOMAIN WALLS BY INTERFACE ENGINEERING

(71) Applicant: MAX PLANCK GESELLSCHAFT ZUR FÖRDERUNG DER WISSENSCHAFTEN EV, Munich (DE)

(72) Inventors: Yicheng Guan, Halle (DE); Tianping Ma, Halle (DE); Robin Blaesing, Halle (DE); Stuart S.P. Parkin, Halle (DE)

(73) Assignee: MAX PLANCK GESELLSCHAFT ZUR FÖRDERUNG DER WISSENSCHAFTEN EV, Munich (DE)

( * ) Notice: Subject to any disclaimer, the term of this patent is extended or adjusted under 35 U.S.C. 154(b) by 108 days.

(21) Appl. No.: 17/927,626

(22) PCT Filed: May 25, 2021

(86) PCT No.: PCT/EP2021/063817

§ 371 (c)(1),
(2) Date: Nov. 23, 2022

(87) PCT Pub. No.: WO2021/239690

PCT Pub. Date: Dec. 2, 2021

(65) Prior Publication Data

US 2023/0170007 A1 Jun. 1, 2023

(30) Foreign Application Priority Data

May 26, 2020 (EP) .................................... 20176531

(51) Int. Cl.

| | |
|---|---|
| ***G11C 11/16*** | (2006.01) |
| ***G11C 19/08*** | (2006.01) |
| ***H10N 50/85*** | (2023.01) |

(52) U.S. Cl.
CPC ........ *G11C 11/161* (2013.01); *G11C 19/0841* (2013.01); *H10N 50/85* (2023.02)

(58) Field of Classification Search
CPC .............. G11C 11/161; G11C 19/0841; G11C 11/1675; G11C 19/0875; G11C 19/0808; H10N 50/85
See application file for complete search history.

(56) References Cited

U.S. PATENT DOCUMENTS

| | | | | |
|---|---|---|---|---|
| 6,834,005 | B1 | 12/2004 | Parkin | |
| 6,958,927 | B1 * | 10/2005 | Nguyen | G11C 11/16<br>365/158 |

(Continued)

FOREIGN PATENT DOCUMENTS

| | | |
|---|---|---|
| EP | 3 171 364 A1 | 5/2017 |

OTHER PUBLICATIONS

Kwang-Su Ryu, See-Hun Yang, Luc Thomas & Stuart S. P. Parkin, Chiral spin torque arising from proximity-induced magnetization, May 23, 2014, Nature Communication 5, Article No. 3910(2014) (Year: 2014).*

(Continued)

*Primary Examiner* — Khamdan N. Alrobaie
(74) *Attorney, Agent, or Firm* — ProPat, LLC; Cathy R. Moore

(57) ABSTRACT

The present invention relates to a magnetic domain wall displacement type memory cell (racetrack memory device) that includes a 4d or 5d metal dusting layer (DL) at the ferromagnetic/heavy metal interface of the ferromagnetic (FM) structure or the synthetic antiferromagnetic (SAF) structure of the basic racetrack device structure.

31 Claims, 9 Drawing Sheets

(56) References Cited

U.S. PATENT DOCUMENTS

| | | | | |
|---|---|---|---|---|
| 9,196,272 | B1 * | 11/2015 | Nikolaev | G11B 5/3912 |
| 2004/0252539 | A1 | 12/2004 | Parkin | |
| 2009/0213503 | A1 * | 8/2009 | Sun | H01F 10/3272 360/324.2 |
| 2012/0241878 | A1 * | 9/2012 | Hu | H10N 50/10 257/E29.323 |
| 2012/0267733 | A1 * | 10/2012 | Hu | H10N 50/85 257/E29.323 |
| 2014/0009993 | A1 | 1/2014 | Parkin et al. | |
| 2014/0009994 | A1 | 1/2014 | Parkin et al. | |
| 2014/0204648 | A1 | 7/2014 | Annunziata | |
| 2016/0056368 | A1 * | 2/2016 | Parkin | G11C 11/161 438/3 |
| 2016/0163961 | A1 * | 6/2016 | Li | G11C 11/161 257/421 |
| 2017/0373246 | A1 * | 12/2017 | Wang | H10N 50/10 |
| 2018/0301266 | A1 * | 10/2018 | Ou | H10N 50/80 |

OTHER PUBLICATIONS

Antiferromagnetic Domain Wall Motion Driven by Spin-Orbit Torques, Takayuki Shiino (Year: 2016).*

Blasing, Robin, et al., "Magnetic Racetrack Memory: From Physics to the Cusp of Applications Within a Decade," Proceedings of the IEEE, New York, US, vol. 108, No. 8.

Kwang-Su, Ryu, et al., "Chiral spin torque arising from proximity-induced magnetization," Nature Communications, vol. 5, No. 1, Sep. 1, 2014.

International Search Report for corresponding PCT Application, PCT/EP2021/063817.

* cited by examiner

Pd
Rh
Ir
FM
SAF
(a)
(b)
(c)
(d)
J = 1.2x10^8 A cm^-2
J = 1.2x10^8 A cm^-2
v (m s^-1)
v_nor (a.u.)
J_th (10^8 A cm^-2)
J_th_nor (a.u.)
t_DL (Å)
t_DL (Å)

INCREASED EFFICIENCY OF CURRENT INDUCED MOTION OF CHIRAL DOMAIN WALLS BY INTERFACE ENGINEERING

CROSS-REFERENCE TO RELATED APPLICATIONS

This application is being filed under 35 U.S.C. § 371 as a National Stage Application of pending International Application No. PCT/EP2021/063817 filed May 25, 2021, which claims priority to the following parent application: European Patent Application No. 20176531.0, filed May 26, 2020. Both International Application No. PCT/EP2021/063817 and European Patent Application No. 20176531.0 are hereby incorporated by reference herein in their entirety.

FIELD OF THE INVENTION

The present invention relates to memory storage systems, and particularly to a memory storage system that uses current to move magnetic domain walls in a magnetic racetrack.

BACKGROUND

Racetrack memory devices are gaining interest as high-density storage devices. These devices are disclosed, for example, in U.S. Pat. No. 6,834,005. More advanced race-track memory cells have already been developed including vertical nanowire storage elements, as disclosed e.g. in US-A 2014/204648.

Especially, racetrack devices based on chiral domain wall (DW) magnetic bits in perpendicularly magnetized ferromagnet/heavy metal thin film systems are a promising candidate for next generation spintronic memories (US-A 2014/0009994, US-A 2014/0009993). These currents can be used, in particular, to manipulate magnetic bits that are encoded within magnetic spin textures (domains, skyrmions, or antiskyrmions) in nanoscale racetracks.

Current-induced domain wall motion (CIDWM) has significantly evolved from in-plane magnetic to synthetic antiferromagnetic (SAF) racetracks due to advances in volume spin-transfer torque (STT) and spin-orbit-torque (SOT) mechanisms. Driven by a chiral spin torque that arises from the spin-orbit coupling in the presence of broken inversion symmetry at ferromagnet/heavy metal (HM) interfaces, Néel domain walls in thin films with strong perpendicular magnetic anisotropy (PMA), stabilized by a Dzyaloshinskii-Moriya interaction (DMI) at the ferromagnet/HM interfaces, can be moved along the current direction at high velocities (e.g. EP3171364A1), in both straight and curved racetracks. The fast and energy efficient motion of such magnetic bits along 2D or 3D racetracks by spin current is a key challenge for its commercial implementation.

An even more efficient DW motion was reported in synthetic antiferromagnet (SAF) racetracks that are composed of two perpendicularly magnetized ferromagnetic sub-racetracks coupled antiferromagnetically across an ultrathin ruthenium layer. The giant exchange coupling torque (ECT) in the SAF structure provides an additional dominating driving mechanism that allows for an increased DW propagation velocity beyond ~1,000 m/s. The ECT in rare earth-transition metal alloys is further maximized at the angular momentum compensation temperature of the ferrimagnetic alloy. Recently, efficient CIDWM was also found in certain magnetic insulators.

Significant progress has been made regarding a detailed understanding of the interface derived chiral spin torque and magnetic chirality with respect to the underlying mechanisms of CIDWM, for example, by varying the HM layer that is in contact with the interface ferromagnetic layer or by tuning the thickness of the ferromagnetic layers.

OBJECT OF THE INVENTION

However, the domain wall velocity is still too low and the threshold current densities are still too high for commercially feasible fast and low power racetrack memory devices. Accordingly, it was an object of the present invention to provide for a more efficient current-induced domain wall motion.

SUMMARY OF ADVANTAGEOUS EMBODIMENTS OF THE INVENTION

The present invention significantly reduces the threshold current densities and greatly increase the efficiency of domain wall motion by introducing an atomically thin 4d or 5d preferably 4d metal "dusting" layer (DL) at the ferromagnetic/heavy metal (HM) interface. In a further preferred embodiment, a sub-atomic-layer-thickness dusting layer of Pd and Rh, more preferably a dusting layer of a thickness of just one monolayer at the HM/ferromagnetic interface is introduced, which increases the domain wall's velocity by a factor of up to 3.5 at a given current density. The Néel DWs move more than three times faster, for the same injected current density, compared to otherwise identical structures without any DL. Moreover, the threshold current density, $J_{th}$, defined as the minimum current density required to overcome the effective pinning field and move the DW, is substantially reduced by incorporating atomically thin DLs.

Without wishing to be bound by this theory it is believed that this improvement is due to a subtle interplay of tailored spin-orbitronic parameters, i.e. parameters that originate from the spin-orbit coupling effects; specifically, the Dzyaloshinskii-Moriya interaction and the uniaxial magnetic anisotropy. The present invention shows how significant interfacial modifications are, to allow for tailored racetracks with enhanced efficiency of chiral domain wall motion and it directly demonstrates the close inner correlation of the Dyzaloshinskii-Moriya interaction with the uniaxial anisotropy.

- a Schematic representation of the FM (upper panel) and SAF (lower panel) racetrack structures with a dusting layer (DL) inserted between the heavy metal (Pt) and ferromagnetic metal (Co) layers.
- b Upper panel: schematic illustration of the atomic stack of the FM/DL/HM structure along the fcc (111) direction; lower panel: the elements employed in the FM/DL/HM stack; various fill geometries correspond to FM, DL, and HM, respectively, as shown. The numbers in the upper right position of each element square correspond to (from top to bottom): the spin-orbit coupling constant, spin diffusion length, and Stoner criterion parameter, respectively. The number in the lower left position is the in-plane lattice constant of the corresponding fcc (111) unit.
- c Scanning electron microscopy of a typical racetrack.

d Cross sectional HRTEM image.

e The corresponding EDX mapping of a FM film with 0.1 nm thick Pd dusting layer, in which the presence of the atomically thin Pd layer is highlighted.

FIG. 2 shows the Interfacial DL engineered chiral domain wall motion in FM and SAF structures.

a-f current-induced DW motion in the FM (left panel) and SAF (right panel) structures with various DL materials: PD (a and b), Rh (c and d), and Ir (e and f). The insets in (a) and (b) illustrate typical Kerr images of the domain wall motion in response to a series of injected current pulses (~$1.0\times10^8$ A/cm$^2$) composed of, respectively, twelve (a) and four (b) 10 ns pulses in the FM and SAF samples with 0.1 nm Pd DL, which confirms that all the SWs move in the direction of current injection. Differences in image contrast originate from the magnetization difference in the FM and SAF samples. The bright and dark parts correspond to down (⊗ or ↓) and up (⊙ or ↑) domains. The thickness of the inserted dusting layers are varied from 0 nm (squares), 0.1 nm (circles), 0.2 nm (diamonds), 0.3 nm (triangles), 0.4 nm (triangles), 0.5 nm (triangles) and 0.7 nm (triangles).

Figure 3:
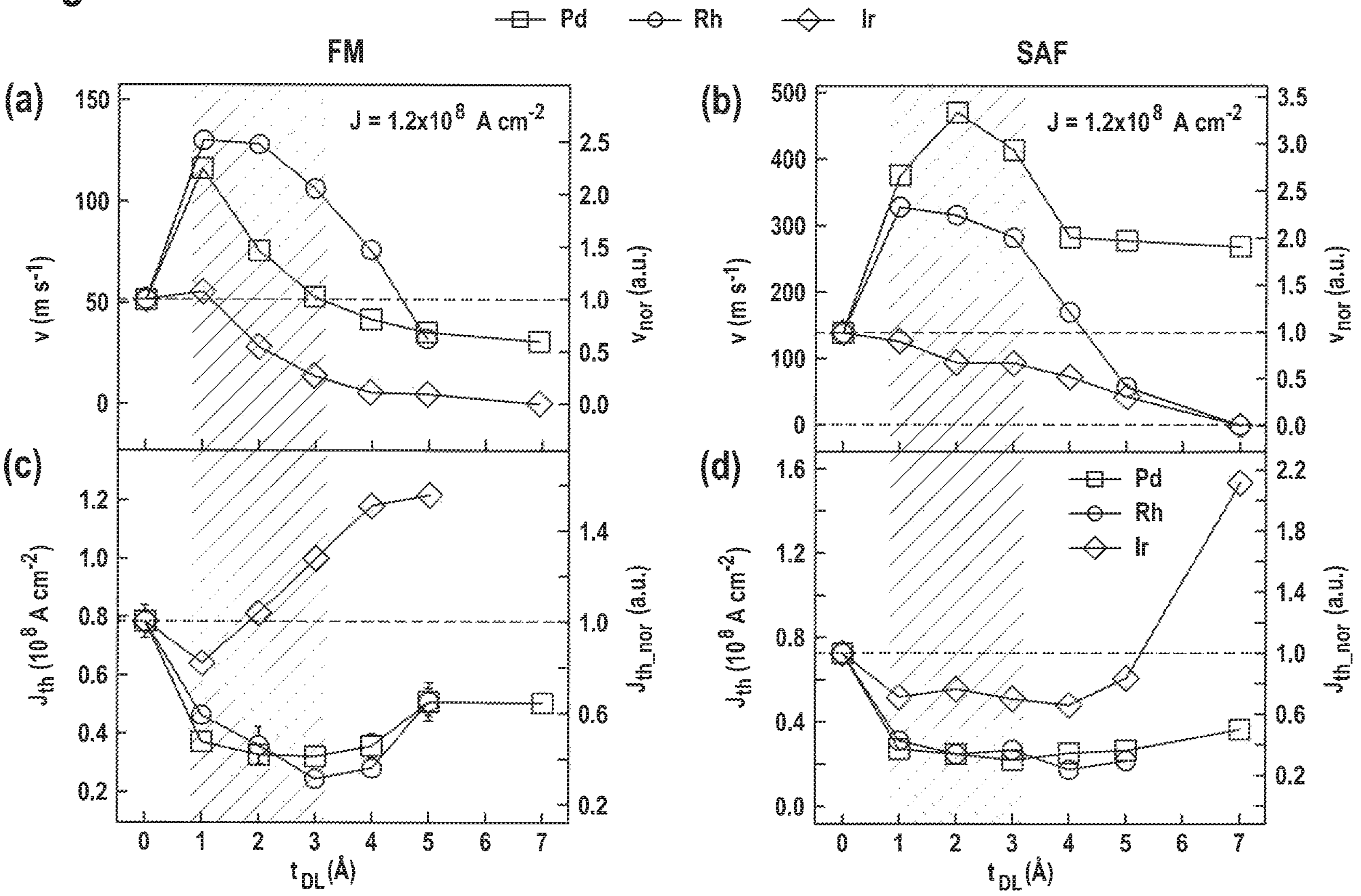

FIG. 3 shows DL thickness dependence of the DW velocity (v) and threshold current density ($J_{th}$).

a and b show the DW velocity at a fixed current density (~$1.2\times10^8$ A/cm$^2$) in the FM and SAF samples with various DL thicknesses ($t_{DL}$). The dash lines represent the velocity of the reference samples and the stationary state of the domain walls. The right axis is the normalized DW velocity ($v_{nor}$) with respect to the reference samples.

c and d are the threshold current density ($J_{th}$) as a function of different DL thicknesses in the FM and SAF samples. The dashed lines represent the threshold current density of the reference samples. The right axis represents the normalized threshold current density ($J_{th\_nor}$) with respect to the reference samples. The regions illustrate the range of interfacial DL thickness where the efficiency of CIDWM is maximized. Pd, Rh, and Ir DL correspond to squares, circles and diamonds, respectively.

FIG. 4 shows the Longitudinal magnetic field dependence of DW velocity on dusting layer.

a-f the longitudinal field dependence of DW velocity (v-$H_x$) at a fixed current density (~$1.2\times10^8$ A/cm$^2$) in the FM (left panel) and SAF (right panel) structures. The open and filled symbols represent the ↑↓ and ↓↑ domain configurations, respectively. The samples with DL thicknesses of 0.1 nm (a and b), 0.2 nm (c and d), 0.3 nm (e and f) and 0.5 nm (g and h) are shown. The reference samples and those with Pd, Rh and Ir DL are represented by triangles, squares, circles, and diamonds, respectively.

Figures 5A, 5B, 5C, 5D:
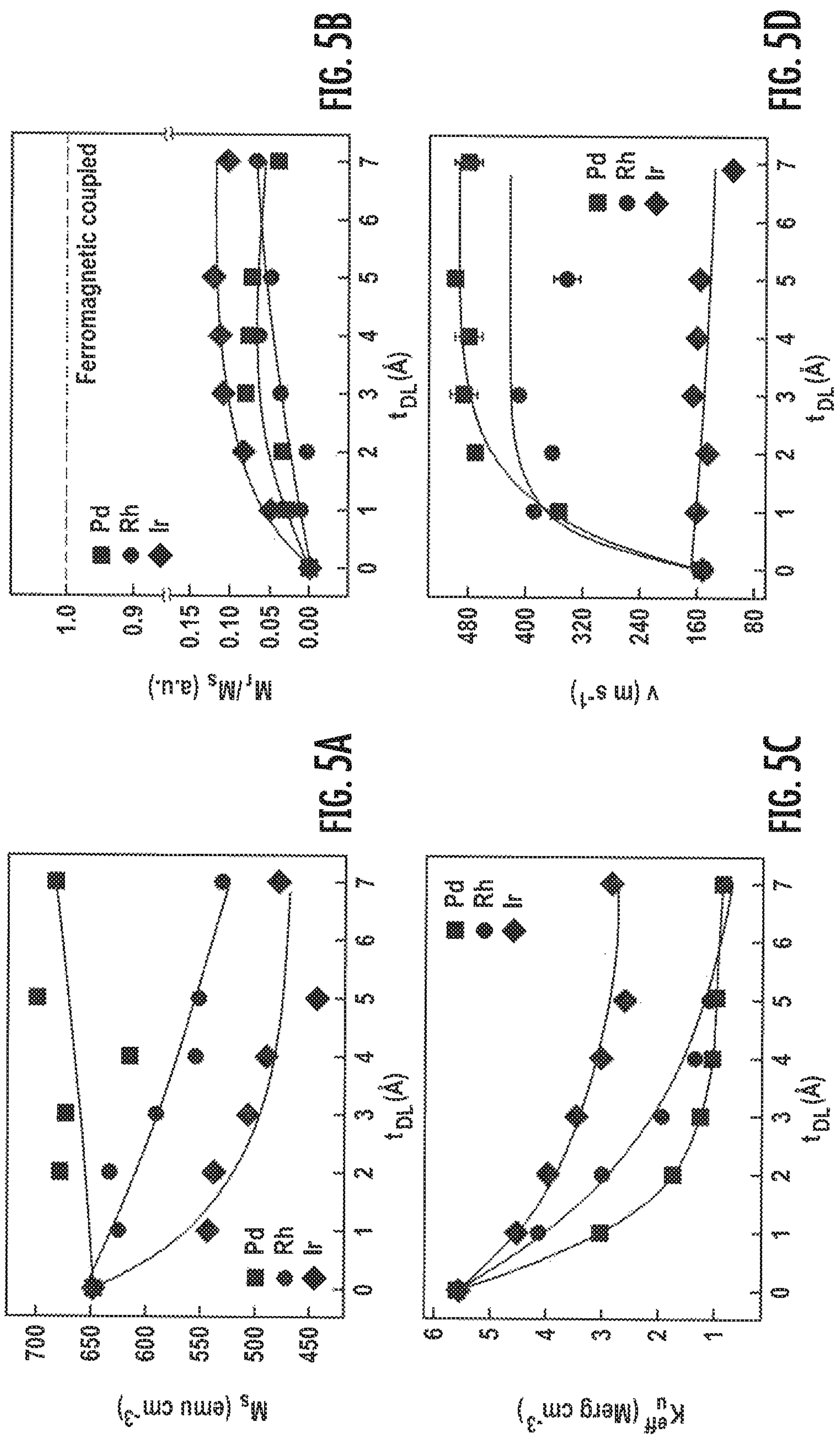
Figure 5F:
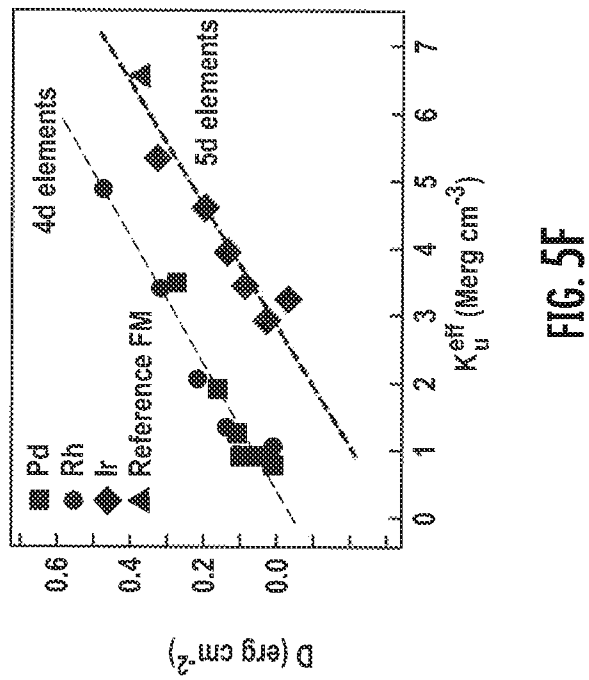

FIG. 5 shows the Interfacial dusting layer engineered magnetic properties.

a The DL thickness dependence the effective uniaxial anisotropy constant $$K_u^{eff}$$

in the FM structures.

b $v_{lg}$ in SAF structures.

c DMI constant D calculated from the FM cases.

d the DMI constant D of all samples plotted as a function of $K_u^{eff}$, in which the dashed lines are the linear fitting of the 4d elements DL cases (Pd and Rh) and 5d elements DL cases (Ir and Pt), respectively. The reference samples and those with Pd, Rh, and Ir DL are represented by triangles, squares, circles, and diamonds, respectively.

DETAILED DESCRIPTION OF THE INVENTION

The basic structure of a racetrack device according to the present invention is based on a ferromagnetic (FM) structure or a synthetic antiferromagnetic (SAF) structure.

The ferromagnetic structure comprises one or more, preferably two or three layer(s) of a ferromagnetic material. If the ferromagnetic structure comprises more than one layer, preferably two neighboring layers are not identical. The ferromagnetic layer is made of ferromagnetic material selected from one or more of:

Fe, Co, Ni or Mn, or an alloy of Fe and/or Co, or an alloy of Ni that may further include one or more of Fe and Co, or an alloy of Mn that may optionally further include one or more of Fe, Co or Ni, or a compound including Fe and at least one of Ir, Al, Si or Ge, and a compound including Mn and Si.

Typically, the ferromagnetic structure may have a total thickness in the range of 0.5 to 1.5 nm, preferably 0.75 nm to 1.3 nm, more preferred 0.9 nm to 1.2 nm. Each individual layer of the ferromagnetic structure may—independently of one another—have a thickness in the range of 0.1 nm-1.5 nm, preferably 0.12 nm to 1.0 nm, more preferred 0.14 nm to 0.8 nm.

The ferromagnetic layer(s) of the ferromagnetic structure are preferably sandwiched between an HM layer and a coupling layer.

The HM layer includes at least one of Pt, Ir, W, Ta or Ru. The HM layer may advantageously have a thickness between 0.8 nm-2.0 nm, preferably 1.0 nm to 1.8 nm, more preferred 1.2 nm to 1.7 nm.

The coupling layer includes at least one of Ru, W, Ta or Ir. The coupling layer may advantageously have a thickness between 0.4 nm 1.5 nm, preferably 0.6 nm to 1.0 nm, more preferred 0.7 nm to 0.9 nm.

The synthetic antiferromagnetic structure may be comprised of two ferromagnetic layers coupled antiferromagnetically via a coupling layer. In a preferred embodiment, the FM/coupling layer/FM sandwich is deposited on a HM layer. The ferromagnetic layers, the coupling layer and the HM layer are as described above. Preferably the coupling layer is comprised of Ru or Ir.

According to the invention the FM and/or SAF Racetrack Memory structures comprise an interfacial dusting layer. This dusting layer is made of a 4d or 5d metal, preferably a 4d metal and most preferred a metal with a long spin-diffusion length of preferably more than 5 nm. It is further preferred that the metal exhibits an fcc structure. Most preferred are Pd and Rh, while Ir and Ru are less preferred.

The dusting layer is preferably located at the HM/FM interface, i.e. the dusting layer is preferably sandwiched between the HM and FM layer.

The thickness of the dusting layer is preferably in the range of 0.1 to 1.5 nm, more preferred 0.1 to 1.0 nm and most preferred 0.2 to 0.7 nm. This means that the dusting layer may have a dimension which is in the sub-atomic-layer-thickness range, which is defined as being within or even below the lattice constant of the selected DL material. In some embodiments the dusting layer has a thickness which is in the range of about the diameter of an atom of the DL material, i.e. in the range of about 0.2 nm; this thickness is called "one monolayer". The "sub-atomic-layer" thickness as well as the "one monolayer" thickness is the equivalent thickness that is estimated from the sputtering deposition rate.

The individual layers of the racetrack device, including the dusting layer, can e.g. be deposited by magnetron sputtering preferably at room temperature on silicon wafers, which are preferably thermally oxidized so that they are covered with a $SiO_2$ layer (~30 nm). The layers are preferably sandwiched between a bottom TaN layer (~2 nm) and a capping TaN layer (~5 nm) both with high resistivities. The deposition parameters of these materials can e.g. be calibrated by quartz crystal microbalance and X-ray reflection. The layer thickness can be determined and controlled by the amount (gram-atom) of material sputtered per square unit (e.g. $nm^2$). Racetrack nanowires can be fabricated using photolithography and argon ion milling. The domain walls (DWs) can be created in the racetrack nanowires by injecting pulses of current in the presence of external longitudinal magnetic fields.

Application

The present invention can be applied in many different areas of technology, e.g. spintronics, including but not limited to: magnetic random access memories; magnetic recording hard disk drives; magnetic logic devices; security cards using magnetically stored information; semiconductor devices wherein large magnetic fields provided by domain wall fringing fields can be used to locally vary the electronic properties of the semiconductor or semiconductor heterostructure; mesoscopic devices, which are sufficiently small so that the electronic energy levels, therein, can be substantially affected by the application of local magnetic fields; etc.

Advantages of the Invention

In models of an ideal racetrack with a homogenous film stack there is no threshold current for CIDWM. Yet, in reality a threshold current of $J_{th}$ has to be applied in order to depin the DW, by thermally aided excitations across an energy barrier that hampers the DW from moving freely in the wire. Once certain DLs are introduced this barrier is decreased, as indicated by reductions in the uniaxial anisotropy energy $K_u$ and coercive field Hc: thus a decrease in $J_{th}$ is observed. However, when the DL is further thickened, an inevitable decrease in $\theta^{SH}$ gives rise to a subsequent increase in $J_{th}$. It is important to notice that for the SAF case, $J_{th}$ corresponds well to that of the corresponding FM case, which suggests the dominant role of the LM layer in determining $J_{th}$.

In order to make possible applications of racetrack memory devices based on CIDWM, both low $J_{th}$ and high DW velocity are often needed. For the FM case, the linear variation of $$K_u^{eff}.$$

on D (=Dzyalonshinskii-Moriya interaction co-efficient) means that once a smaller $J_{th}$ is realized, the saturation velocity ($v_D=\gamma D/M_s$) is also smaller. However, in the SAF case, since the DW is mainly driven by the ECT, the maximum velocity is largely determined by the exchange coupling constant $$J_{ex}\left(v_{ex}=\frac{2\gamma\Delta J_{ex}}{M_s}\right)$$

when the two sub-layers are the same with each other. Thus, a low $J_{th}$ and high velocity can both be achieved in the ECT-driven DWM of SAF structure by simply decreasing $$K_u^{eff}$$

as indicated from the DL thickness dependence of $v_{lg}$, as shown in FIG. 5*d*. When Pd and Rh DL are inserted into the system, the total $\theta^{SH}$ is well preserved due to their relatively long spin diffusion lengths, see FIG. 1*b*. Hence, the considerable enhancement of $v_{lg}$ comes mainly from the increase of DW width due to the decrease of $$K_u^{eff}.$$

For the Ir case, however, just as in the FM case, the quickly dropping $\theta^{SH}$ can no longer provide enough SOT for the DWM. Thus, a $v_{lg}$ with a smoothly decreasing trend is observed.

In conclusion, the present invention provides a novel method to substantially decrease the current needed to both depin and to move chiral domain walls in magnetic racetracks. This method involves the insertion of atomically thin 4d or 5d-element dusting layers, preferably dusting layers made from 4d-elements with fcc structure at critical interfaces, preferably at the FM/HM interface in magnetic multilayers that form simple ferromagnetic or synthetic antiferromagnetic racetracks. A clear linear correlation between the perpendicular magnetic anisotropy exhibited by the ferromagnetic racetracks and the Dzyaloshinskii-Moriya interaction that gives rise to the chirality of the domain walls was found for both 4d and 5d elemental insertion layers. These findings are realized through the controlled manipulation of interfacial spin-orbit coupling The present invention is illustrated by the following examples.

EXAMPLES

Atomically Thin Dusting Layers

Figure 1A:
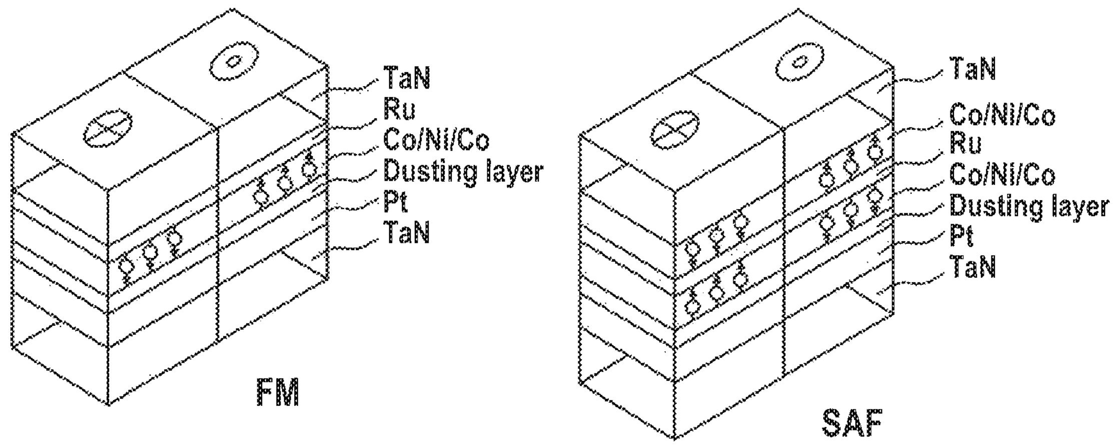
FIG. 1 shows Engineered FM and SAF Racetrack Memory structures with interfacial dusting layers.
Figure 1B:
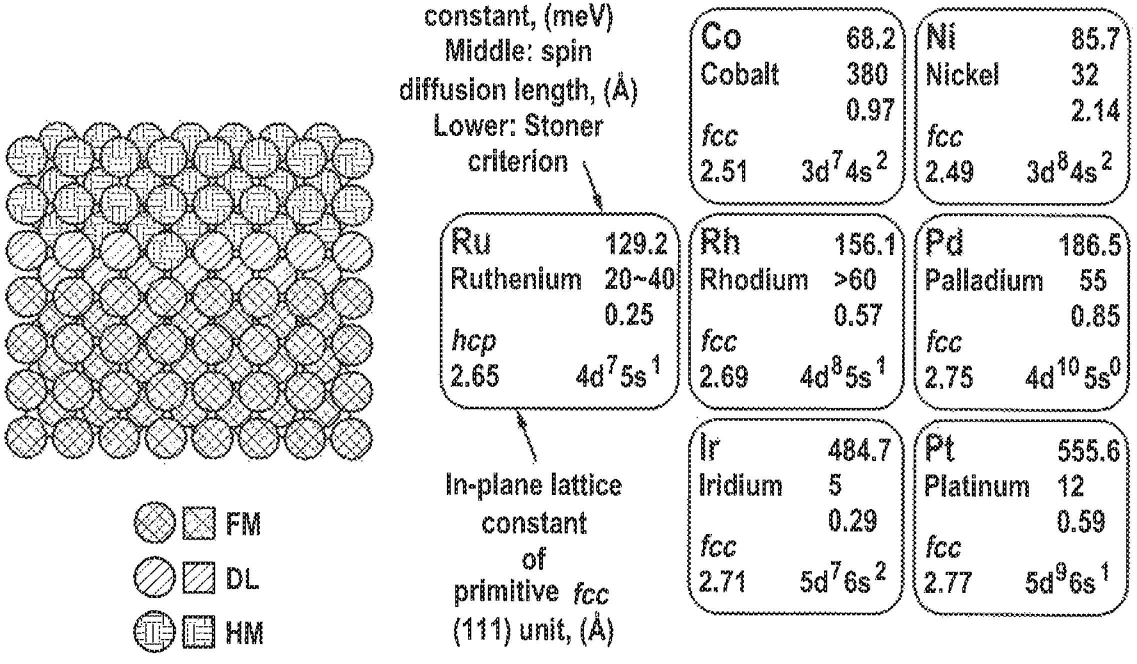
Figure 1C:
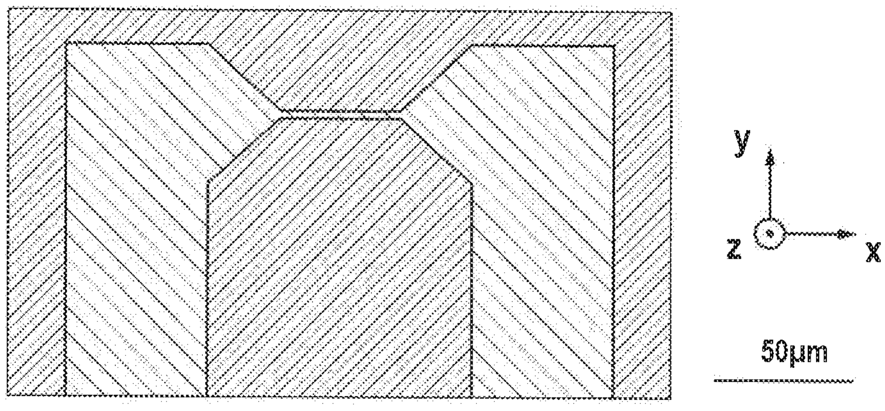

Two sets of structures were prepared by DC magnetron sputtering at room temperature as shown in FIG. 1*a*: a ferromagnetic structure consisting of Co (0.3 nm)/Ni (0.7 nm)/Co (0.15 nm) sandwiched between a Pt (1.5 nm) HM layer and a Ru (0.85 nm) coupling layer, hereafter referred to as a FM structure; and a synthetic antiferromagnetic structure deposited on the same Pt (1.5 nm) HM layer and consisting of a lower ferromagnetic layer of Co (0.3 nm)/Ni (0.7 nm)/Co (0.15 nm) and an upper ferromagnetic layer of Co (0.5 nm)/Ni (0.7 nm)/Co (0.15 nm) antiferromagnetically exchange coupled through a Ru (0.85 nm) coupling layer, hereafter referred to as a SAF structure. A series of atomically thin layers (hereafter referred to as dusting layers, DL) of Pd, Ir, Rh, and Ru with thicknesses varying from 0.1 to 0.7 nm are inserted directly onto the Pt HM layer in both structures before depositing the ferromagnetic materials. Schematic images of the FM and SAF structures are shown in FIG. 1*a* with the elemental dusting layers illustrated in FIG. 1*b*. CIDWM was studied in a typical racetrack that was 3 μm wide and 50 μm long, fabricated by photolithography and Ar ion milling (FIG. 1*c*). The motion of individual DWs in these nanowires in response to voltage pulses of a fixed length (~10 ns) was detected using Kerr microscopy. The DW positions in the nanowire before and after the pulse injection are recorded and, thereby, used to determine the DW velocity along the racetrack.

Figure 1D:
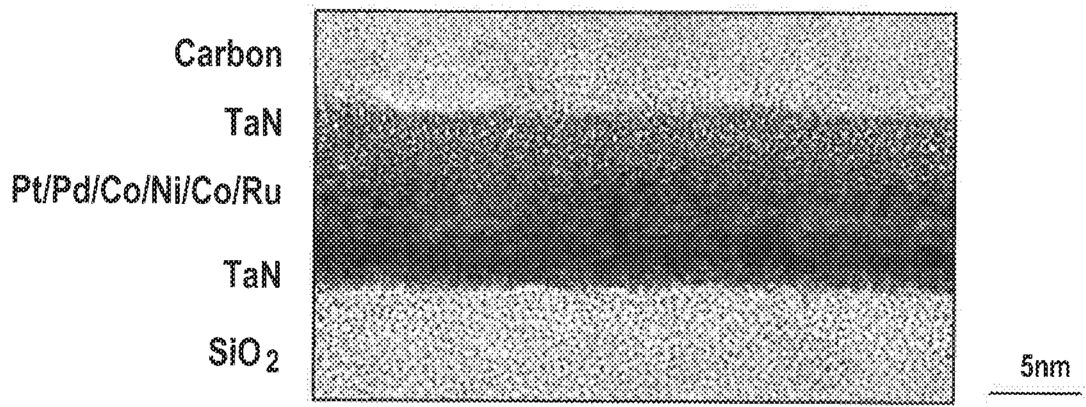
Figure 1E:
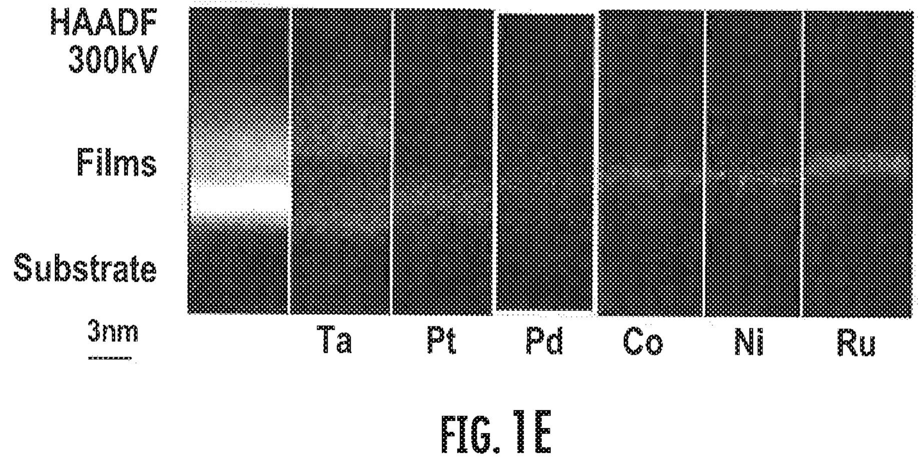

A cross-sectional high-resolution transmission electron microscopy (HRTEM) image of the FM structure with a 0.1 nm palladium dusting layer is shown in FIG. 1*d*. The image presents a highly (111) oriented structure of the face-centered cubic (fcc) thin film structure along the out-of-plane direction. The very smooth surface of the films is confirmed by atomic force microscopy imaging. The high-angle annular dark field scanning TEM (HAADF-STEM) image and the associated energy dispersive X-ray spectrometry (EDX) maps of the layered structure in FIG. 1*e* directly reveal the Pd dusting layer at the expected location between the Pt layer and the Co/Ni/Co layer, even though the inserted Pd DL is only 0.1 nm thick.

Current Induced Chiral DW Motion

Figures 2A, 2B, 2C, 2D:
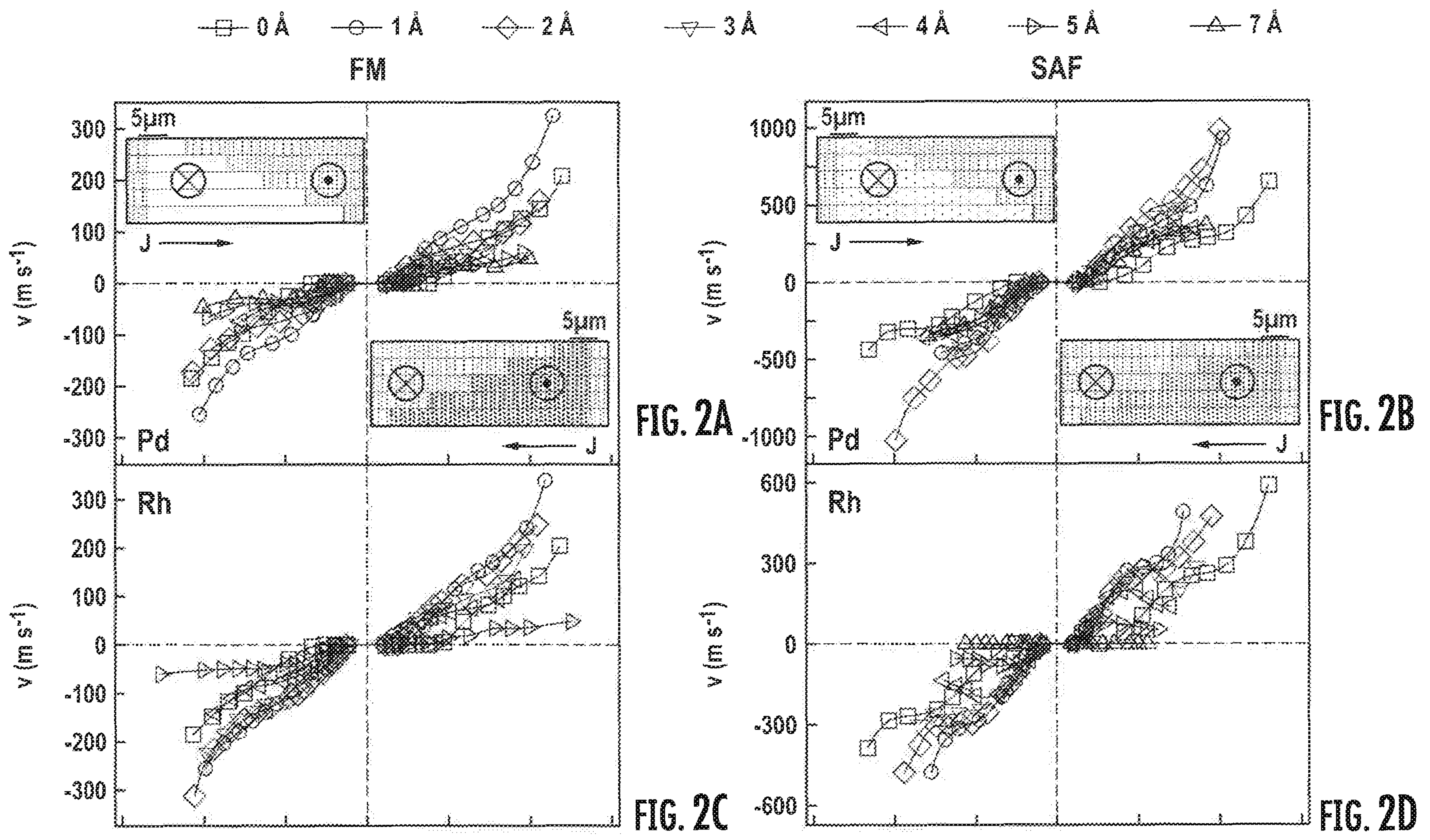
Figure 2F:
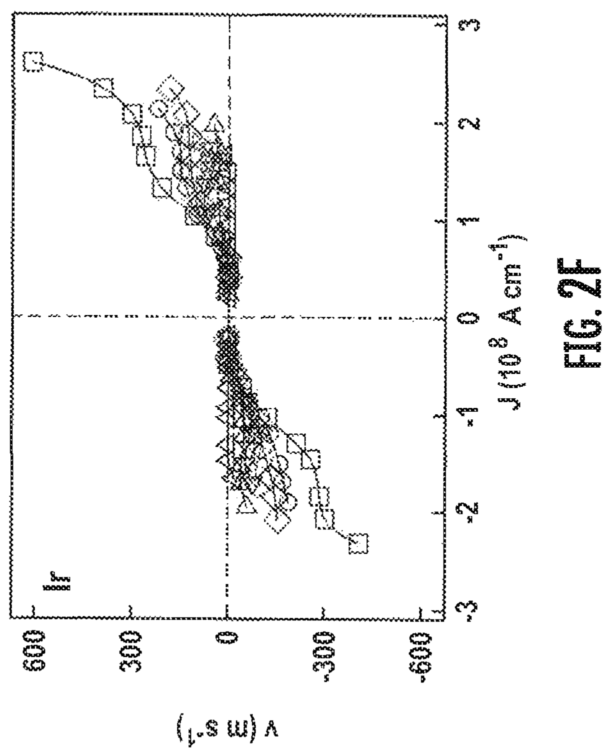

The chiral spin torque drives DWs along the direction of injected current irrespective of the DL parameters. Distinct CIDWM behaviors are observed in the FM and SAF structures that depend sensitively on the DL material and thickness. In the Pd DL case, the threshold current density $J_{th}$ required to observe DW motion is found to be significantly decreased in the FM structure with a Pd DL as thin as only 0.1 nm (FIG. 2*a*), and the DW velocity is increased over the entire range of current density considered. The maximum current density that can be applied to the racetracks is limited by the formation of multiple magnetic domains that is believed to be due to an increase in temperature of the nanowire as has previously been observed in nanowires of comparable resistance. As the Pd layer thickness is increased, the maximum current density decreases together with a degradation of the CIDWM performance. By contrast, for the SAF structure, FIG. 2*b* shows that the introduction of Pd DLs improves the efficiency of the CIDWM for all DL thicknesses considered, with significantly higher DW velocities for otherwise the same current density compared to the SAF structure without any DLs (reference SAF). The efficiency of the DW motion is maximized for Pd DL thickness that are ~0.2 nm thick with a DW velocity of up to ~1000 m/s, as shown in FIG. 2*b*. This velocity is up to 3.5 times higher by comparison with the same structure without the Pd DL at the same current density.

The racetracks with Rh dusting layers behave similarly as for Pd DLs. The range of DL thickness for which the CIDWM is enhanced is extended up to 0.4 nm for the FM case and with a substantially reduced $J_{th}$ (FIG. 2*c*). The PMA for a 0.7 nm Rh DL was too weak to allow for CIDWM measurements. For the SAF case shown in FIG. 2*d*, the CIDWM is enhanced for 0.1 and 0.2 nm thick Rh DLs. For thicker Rh layers (>0.3 nm), however, the DW velocity rather drops with increasing current density. Though the PMA is so weak at 0.7 nm in the FM case that no DW motion could be successfully detected, stable single DWs can still be generated in the SAF case as a result of the exchange coupling, but no sizeable CIDWM could be observed before thermal nucleation of random DWs takes place.

Figure 2E:
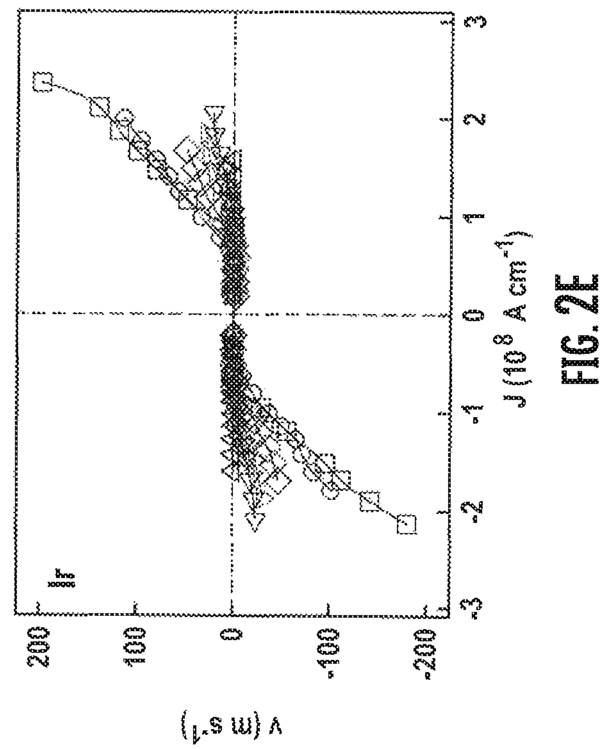

A significantly different behavior is observed when an Ir DL is employed. In the FM case, as illustrated in FIG. 2*e*, $J_{th}$ drops when the Ir layer is 0.1 nm thick, but then increases almost linearly with further increases in the Ir thickness. Only a very slight enhancement in the CIDWM velocity was observed at low current densities for 0.1 nm Ir but otherwise CIDWM was slower than the reference FM sample. For the SAF structure, a systematic deterioration of the CIDWM occurs as soon as an Ir DL is inserted (see FIG. 2*f*). However, it is worth noting that $J_{th}$ drops smoothly for Ir layers with thicknesses up to 0.5 nm but increases dramatically for thicker layers.

To directly compare the influence of different dusting layers on the performance of CIDWM, the threshold current density $J_{th}$ and the DW velocity are plotted at a current density of ~$1.2\times10^8$ A/cm$^2$, as a function of DL thickness $t_{DL}$ in FIG. 3*a*-3*d* for both the FM and SAF structures. The dramatic role of the DL is readily seen and is most pronounced for Pd and Rh DLs. In these cases, the CIDWM efficiency increases substantially for small $t_{DL}$, reaching a maximum at ~0.2 and ~0.1 nm respectively. For Ir dusting layers, however, the CIDWM efficiency increases slightly only for the 0.1 nm case and then monotonically decreases until zero propagation as $t_{DL}$ is increased (FIGS. 3*a* and 3*b*).

To distinguish CIDWM from DW creep that occurs even at tiny current densities, a threshold current density $J_{th}$ was defined as the current density above which the chiral DW velocity exceeds 5 m/s. Generally, a decrease in $J_{th}$ was found for racetracks with DLs except for the Ir case. It is worth noting that the spacing between adjacent fcc (111) planes of the dusting layers is ~0.22 nm which corresponds to the middle of the colored region in FIG. 3. A plausible argument can thus be made that the efficiency of the chiral DW motion is maximized by inserting one monolayer thick 4d metal (Pd and Rh) DL. Specifically, the most promising case is the SAF structure with a 0.2 nm thick Pd DL layer: a substantial decrease of ~70% in $J_{th}$ and a ~350% increase in CIDWM velocity compared to the reference sample was observed at a typical current density of $1.2\times10^{12}$ A/m$^2$, exhibiting very fast DW speeds of up to ~1000 m/s.

Magnetic Field Dependence of DW Velocity

Figures 4A, 4B, 4C, 4D:
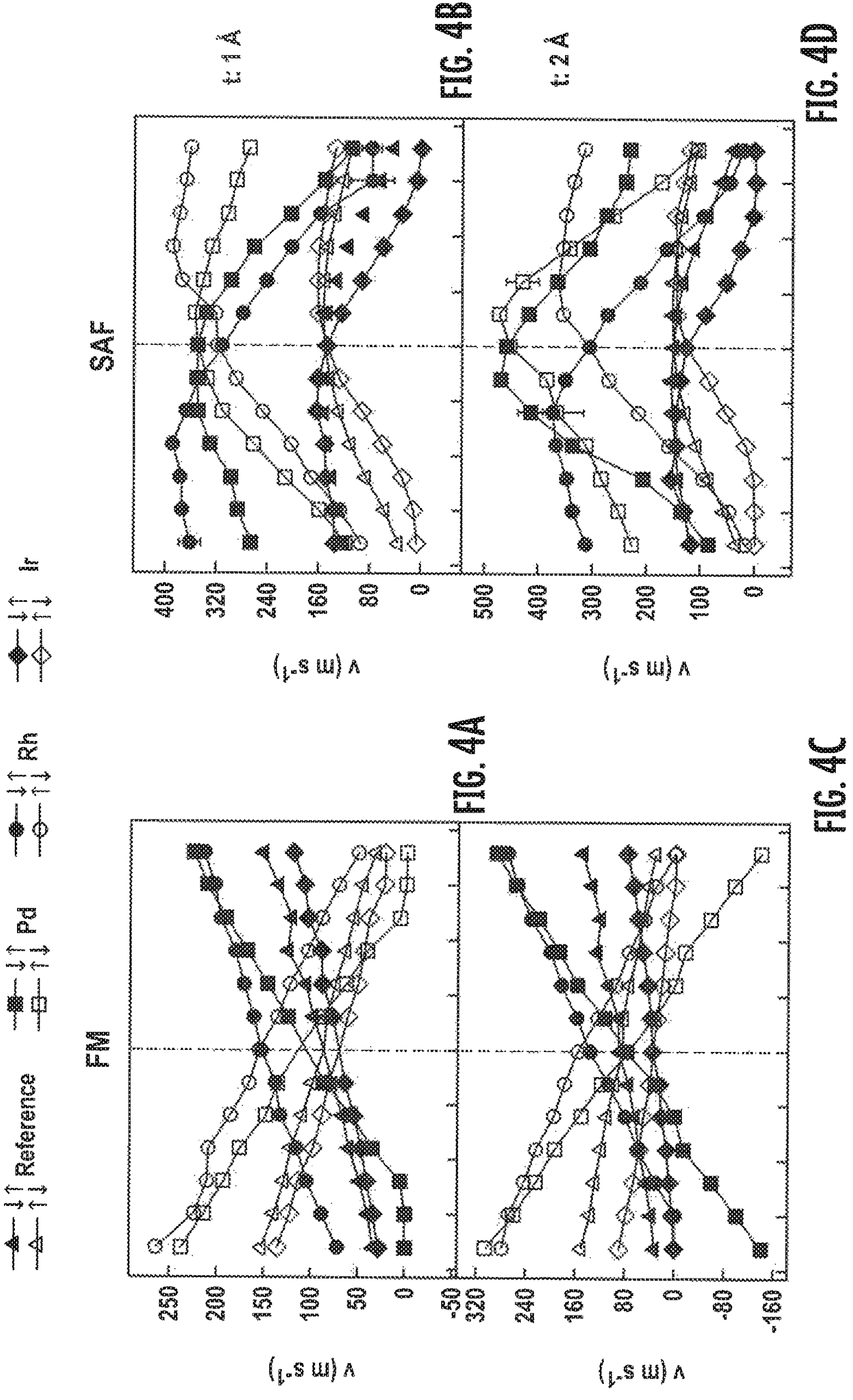
Figures 4E, 4F, 4G, 4H:
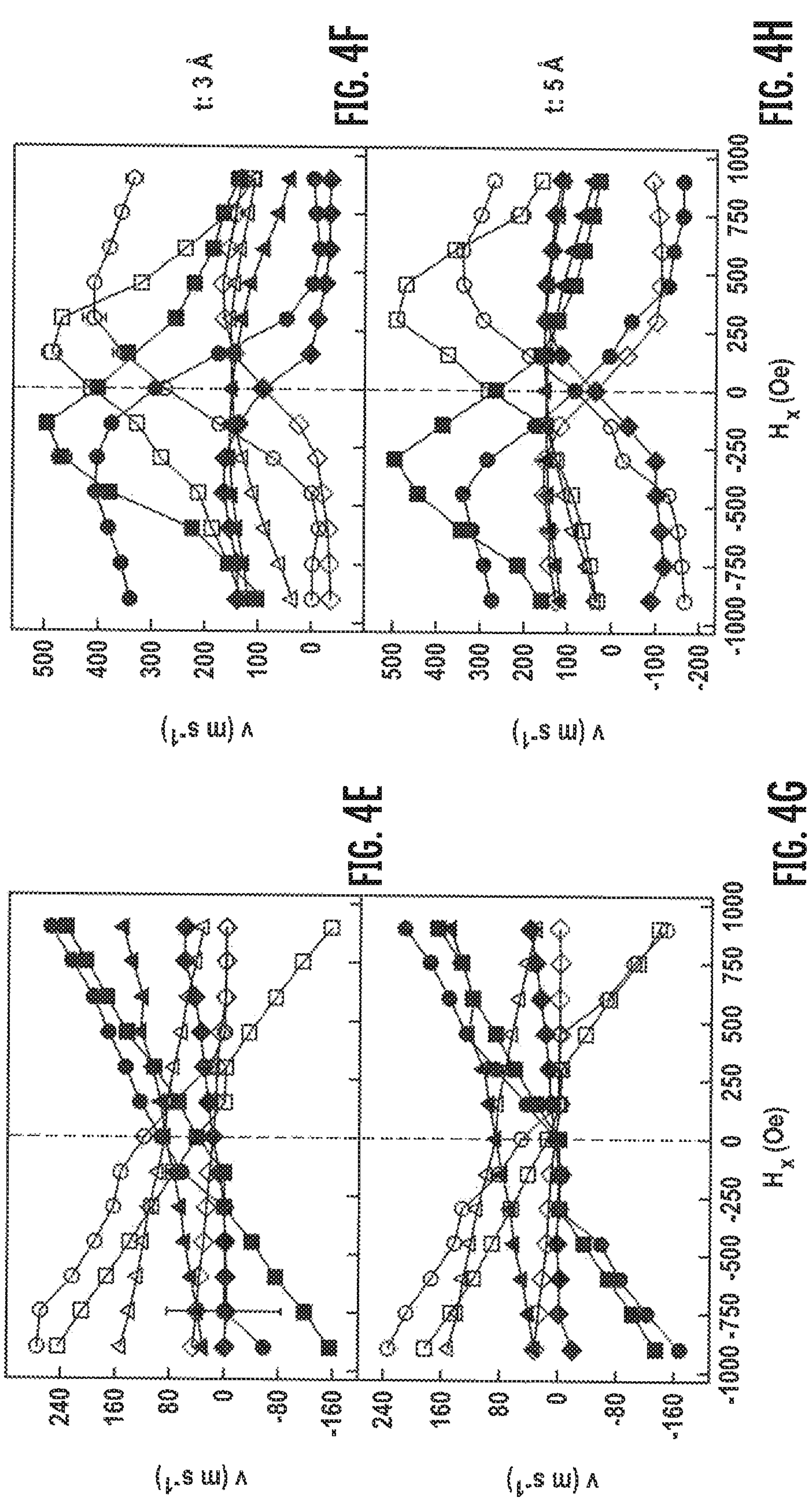

The CIDWM is derived from a chiral spin torque, in which the chirality of the DWs in both the FM and SAF structures is stabilized by an interfacial DMI arising from the HM layers with strong spin-orbit coupling. The DW velocity thus depends sensitively on magnetic fields applied along the racetrack: external longitudinal magnetic fields $H_x$ add or subtract from the DMI effective fields that stabilize the chiral DWs. The DW velocity was measured as a function of a longitudinal magnetic field. For simplicity, the movement of DWs with ↓↑ and ↑↓ domain configurations under positive current are shown in FIG. 4, in which the racetracks incorporating Pd, Rh, and Ir DLs with thicknesses of 0.1, 0.2, 0.3, and 0.5 nm are presented. Data are shown at a fixed current density ($1.2\times10^8$ A/cm$^2$). In zero external field both ↓↑ and ↑↓ DWs move in the same direction as that of the injected current for both the FM and SAF structures, which is consistent with SOT and ECT. For the FM structure presented in FIG. 4*a*-4*d*, the DW velocity shows a linear dependence on $H_x$, which is a typical behavior as previously observed for this reference structure. The slope varies with the materials and thicknesses of the DL and the sign reverses for ↓↑ and ↑↓ DWs, that is $v(\downarrow\uparrow, H_x, J)=v(\downarrow\uparrow, -H_x, J)$. This behavior can be readily understood within a 1-D DW analytical model. Such behavior has two key characteristics: the slope of the v-$H_x$ curve, and the magnitude of $H_x$ where the DW velocity goes to zero. Thus, by fitting the v-$H_x$ curves, magnetic properties that cannot be directly measured, especially, the interfacial DMI strength D can be estimated.

For the SAF case, a distinct profile of the v-$H_x$ curve is observed, with a symmetric effect of DW chirality on the DW velocity such that v(↓ ↑, $H_x$, J)=v(↑ ↓, −$H_x$, J). The coupled Néel DWs in the SAF structure undergo a more complicated response in the presence of an external field. Several magnetic properties contribute to the detailed shape of the response curves. A 1-D model is used to reproduce the experimental results and extract these parameters. FIGS. 4*b*, 4*d*, 4*f*, and 4*h* show that the variation of DW velocity with external field is increased with thickness of the inserted Pd and Rh DLs. The DW velocity, however, is less sensitive to the thickness of the Ir DL, which should correlate with the relatively weak spin hall effect in Ir. Remarkably, as the thickness of the Ir DL is increased beyond 0.5 nm (FIG. 4*h*), the corresponding v-$H_x$ curves are mirror profiles of those for thinner Ir DL. We attribute this opposite dependence of DW velocity to the reported opposite sign of interfacial DMI at the Co/Ir interfaces compared to Co/Pt interfaces.

Magnetic Properties

In order to understand the dependence of CIDWM on dusting layer materials and thicknesses, magnetic properties including saturation magnetization $M_s$, effective perpendicular magnetic anisotropy constant $$K_u^{eff}$$

(defined as $$K_u^{eff} = K - 2\pi M_S^2 = H_K^{eff} M_S/2$$

where K is the perpendicular magnetic anisotropy and $$H_K^{eff}$$

the hard axis anisotropy field), interfacial DMI constant D and the ratio of the remnant magnetization (magnetization at ~0 T) to saturation magnetization (magnetization field ~1.5 T) ($M_r/M_s$) in the SAF structures were measured. The dusting layer thickness dependence of these parameters are plotted in FIGS. 5*a*-5*c* and 5*e*. A coherent drop in $$K_u^{eff}$$

can be observed with increasing thickness of the DL in all cases (FIG. 5*c*). $M_s$ shows no systematic change with Pd insertion layer thickness, while a monotonic drop for the Ir and Rh DL cases is observed in FIG. 5*a*. As is well known, the proximity induced magnetic moments (PIM) in the heavy metal contribute considerably to the total $M_s$ of the FM/HM system. Based on the Stoner criterion (FIG. 1*b*), it would not be surprising if the PIM decreases when Ir and Rh layers are inserted between the Co and Pt layers. On the other hand, we suppose that there may be a considerable PIM in the Pd dusting layer itself since Pd is very close to the Stoner criteria for magnetism.

The dependence of $M_r/M_s$ on $t_{DL}$ is shown in FIG. 5*b*. The changes in $M_r/M_s$ ratio with DL insertion are predominantly due to the variation of $M_s$ in the lower sub-layer of the SAF structure, as can be seen for the FM case in FIG. 5*a*. It has previously been shown that CIDWM in SAF samples is largely derived from a giant ECT that is increased, the more similar are the two sub-layer moments, i.e. $M_r/M_s$=0. Note that the reference SAF sample without any DL has been optimized so that $M_r/M_s$ is close to zero. As discussed above, the efficiency of CIDWM is increased with certain DLs even though this causes $M_r/M_s$ to deviate from zero. Thus, even faster CIDWM in the DL engineered racetracks is promised when $M_r/M_s$ is tuned to zero by small modifications to the racetrack structure.

The fastest DW velocity $v_{lg}$ in the SAF structure is reached with the aid of an external longitudinal field as shown in FIG. 4. The DL thickness dependence of $v_{lg}$ is plotted in FIG. 5*d*. For the Pd and Rh dusting layers, $v_{lg}$ increases rapidly and then saturates as the DL is thickened. For Ir DLs, however, $v_{lg}$ remains almost constant with a gradual decrease when the DL thickness is increased. These results suggests that the DLs employed here can be separated into two groups with respect to their response to $H_x$ or, thereby, the DMI field.

Figure 5E:
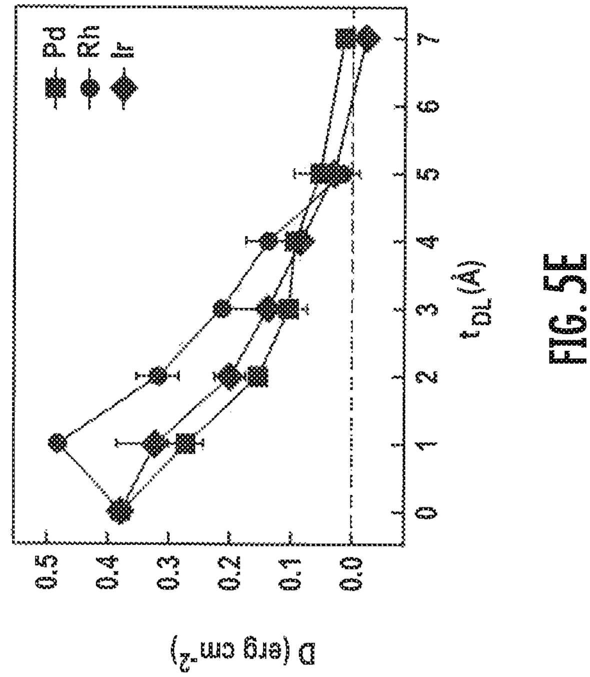

In the FM structure, a monotonic drop in the DMI constant D is observed with increasing DL thickness except for a slight increase for the Rh ~0.1 nm case (FIG. 5*e*). It is worth noticing, as the Ir DL thickness is increased, there is a clear sign change of D.

Manufacturing Method and Measurement Methods

Sample Preparation and DW Velocity Measurement

The samples are deposited by magnetron sputtering at room temperature on Si wafers covered with a $SiO_2$ (thermally oxidized Si) layer (~30 nm). All these samples are sandwiched between a bottom TaN layer (~2 nm) and a capping TaN layer (~5 nm) both with high resistivities. The deposition parameters of these materials were calibrated by quartz crystal microbalance and X-ray reflection. The 50 μm×3 μm racetrack nanowires are fabricated using photolithography and argon ion milling. All the injected current pulses are fixed at a duration of ~10 ns. The DW velocities are determined from Kerr microscopy measurements. The DWs are created in the racetrack nanowires by injecting pulses of current in the presence of external longitudinal magnetic fields.

TEM Specimen Preparation and Investigation

The cross-sectional TEM specimens were formed by conventional preparation methods. First, the cross-sections were polished mechanically from both sides. Then, they were dimple-grinded from one side and thinned down to electron transparency by polishing with Ar ions at 5 kV from the other side in a Gatan PIPS (precision ion polishing system) system (Gatan, USA, Pleasanton). For HR-TEM/STEM investigations, a FEI TITAN 80-300 electron microscope with a probe corrector (FEI, USA, Hillsboro) was used at an accelerating voltage of 300 kV. The EDX experiments were performed with a Super-X detector system (4 silicon drift detectors placed symmetrically around the sample area inside objective lens (Oxford, UK, Abingdon)) installed on the microscope for faster and better collection efficiency of X-rays. Acquired EDX maps were analyzed and processed by Bruker Esprit software (Bruker, USA, Billerica).

Magnetic Property Measurements and Calculation of DMI Constant D

The magnetizations of the sample were measured in a superconducting quantum interference device (SQUID) at room temperature.

$$H_K^{eff}$$

is measured using vibrating sample magnetometer measurements, in which the magnetization is recorded with the magnetic field along the hard axis of the films.

$$H_K^{eff}$$

is defined as the field where the total magnetization rotates from out-of-plane to in-plane. The $M_r$ and $M_s$ of the SAF samples are determined at a field of 0 Oe and 15 kOe, respectively, in the out-of-plane M-H curves. The $H_{DMI}$ of the FM structure is extracted, according to a 1-D model, at the field where the DW velocity drops to 0 in the linear fitting of the v-$H_x$ curve. The DW width is calculated from $$\Delta = \sqrt{A/K_u^{eff}}$$

with A, the exchange stiffness, set to be a constant of 1.0 μerg/cm. In the FM structure, when the internal DMI effective field ($H_{DMI}$) is compensated by an external longitudinal field, the Néel wall structure that is stabilized by DMI is no longer sustained. This results in a minimized SOT and therefore a stationary DW. The DMI constant D is calculated from the expression $D=\mu_0 M_s \Delta H_{DMI}$.

Derivation of $v_{lg}$ from 1-D Analytical Model on Steady Motion Condition

From the 1-D analytical model based on the DW moment describing the DWM of the SAF system, the DW velocity $\dot{q}$ could be rewritten as the following forms with a steady-state solution as a fixed DW moment:

$$\dot{q} = \frac{1}{\alpha_U M_L + \alpha_L M_U}\left[-M_L\beta_L u_L - M_U\beta_U u_U \mp \frac{\gamma\Delta M_L \pi H_L^{SH}}{2}\cos\psi_L \pm \frac{\gamma\Delta M_U \pi H_U^{SH}}{2}\cos\psi_U\right]$$

$$\dot{q} = \mp\gamma\Delta\left\{\frac{H_L^k}{2}\sin 2\psi_L - \frac{\pi}{2}H_L^{lg}\sin\psi_L - \frac{2J_{ex}}{M_L}\sin(\psi_L-\psi_U)\right\} \mp u_L$$

$$\dot{q} = \pm\gamma\Delta\left\{\frac{H_U^k}{2}\sin 2\psi_U - \frac{\pi}{2}H_U^{lg}\sin\psi_U - \frac{2J_{ex}}{M_U}\sin(\psi_U-\psi_L)\right\} \mp u_U$$

Where $\alpha_i$ is the damping parameter of each sublayer, with i corresponds to L (lower) or U (upper) layer; $M_i$ is the magnetization; $\beta_i$ is the non-adiabatic constant; $u_i$ is the STT-related (spin transfer torque) DW velocity; $\gamma$ is the gyromagnetic ratio; $\Delta$ is the DW width;

$$H_i^k$$

is the in-plane shape anisotropy field favoring Bloch wall;

$$H_i^{lg}$$

is the net longitudinal field including $H_x$ applied and DMI effective field; $\psi_i$ is the angle between inner magnetization direction of the DW in each layer and x-axis;

$$H_i^{SH}$$

is the spin Hall effective field in each layer; $J_{ex}$ is the interlayer exchange coupling constant.

When an exterior longitudinal field is applied to the system, as indicated from the first equation, the velocity will always peak at the field where the SOTs are maximized as $\psi_L=0$ or $\pi$ since the lower layer experienced larger SOT than the upper layer. If one takes a simple assumption as $M_L=M_U=M$ and neglecting the STT-related term, by taking the condition of $\psi_L=0$ or $\pi$, then the equation sets above could be rewritten into the following form:

$$v_{lg} = \frac{\pi\gamma\Delta}{2\alpha}\left[\pm\frac{H_L^{SH}}{2} \pm \frac{H_U^{SH}}{2}\cos\psi_U\right]$$

$$v_{lg} = \pm\frac{2\gamma\Delta J_{ex}}{M}\sin\psi_U$$

$$\cos\psi_U = \frac{\pi H_{lg}^U}{2H_U^k}$$

For the Pd and Rh case, since the long spin-diffusion length in these materials, one could expect the SOT generated from the Pt bottom layer not decaying so much when traveling through the DL, so the $v_{lg}$ is directly proportional to the DW width and thus shows a similar saturation behavior of DW width with increasing thickness. For the Ir case, the SOT is largely decreased with increasing the DL thickness, together with a slightly modified DW width. Thus, the $v_{lg}$ has small variations with varying DL thicknesses.

The invention claimed is:

1. A magnetic domain wall displacement type memory cell comprising a ferromagnetic layer, a heavy metal (HM) layer and a dusting layer (DL) consisting of a 4d metal, wherein the dusting layer is located at an interface between the ferromagnetic layer and the heavy metal layer of (i) a ferromagnetic (FM) structure or (ii) a synthetic antiferromagnetic (SAF) structure of a basic racetrack device structure, wherein (i) the ferromagnetic (FM) structure comprises one or more layer(s) of a ferromagnetic (FM) material the heavy metal (HM) layer and a coupling layer; and (ii) the synthetic antiferromagnetic (SAF) structure comprises two layers of a ferromagnetic (FM) material which are coupled antiferromagnetically via a coupling layer, with the coupling layer disposed between the two ferromagnetic (FM) material layers to form a FM layer/coupling layer/FM layer sandwich, with said sandwich deposited on the dusting layer disposed on the heavy metal (HM) layer.

2. The memory cell according to claim 1, wherein the dusting layer has a thickness in the range of 0.1 to 1.5 nm.

3. The memory cell according to claim 1, wherein the dusting layer metal exhibits fcc structure.

4. The memory cell according to claim 1, wherein the dusting layer metal is Pd or Rh.

5. The memory cell according to claim 4, wherein the dusting layer metal is Pd.

6. The memory cell according to claim 4, wherein the HM layer is selected from at least one of Pt, Ir, W, Ta or Ru and has a thickness ranging from 0.8 to 2.0 nm.

7. The memory cell according to claim 1, wherein the ferromagnetic (FM) material is selected from the group consisting of:

Fe, Co, Ni or Mn, an alloy of Fe and/or Co, an alloy of Ni that may optionally further include one or more of Fe and Co, an alloy of Mn that may optionally further include one or more of Fe, Co or Ni, a compound including Fe and at least one of Ir, Al, Si or Ge, and a compound including Mn and Si.

8. The memory cell according to claim 1, wherein the ferromagnetic (FM) structure comprises one or more layer(s) of the ferromagnetic material are sandwiched between the HM layer and the coupling layer.

9. The memory cell according to claim 1, wherein the HM layer includes at least one of Pt, Ir, W, Ta or Ru.

10. The memory cell according to claim 1, wherein the HM layer has a thickness of 0.8 nm to 2.0 nm.

11. The memory cell according to claim 1, wherein the coupling layer includes at least one of Ru, W, Ta or Ir.

12. The memory cell according to claim 1, wherein the coupling layer has a thickness of 0.4 nm to 1.5 nm.

13. The memory cell according to claim 1, wherein the ferromagnetic structure comprises more than one layer, and the two neighboring layers are identical or not identical.

14. A method for reducing the threshold current densities and increasing the efficiency of domain wall motion in the magnetic domain wall displacement type memory cell according to claim 1 comprising introducing the 4d-metal dusting layer (DL) at the ferromagnetic/heavy metal (HM) interface of the ferromagnetic (FM) structure or the synthetic antiferromagnetic (SAF) structure of the racetrack memory device.

15. A spintronics device comprising a memory cell according to claim 1.

16. The spintronics device according to claim 15, wherein said spintronics device is selected from magnetic random access memories; magnetic recording hard disk drives; magnetic logic devices; security cards comprising magnetically stored information; semiconductor devices; or mesoscopic devices.

17. The memory cell according to claim 1, wherein the dusting layer has a thickness in the range of 0.1 to 1.0 nm.

18. The memory cell according to claim 1, wherein the dusting layer has a thickness in the range of 0.2 to 0.7 nm.

19. The memory cell according to claim 1, wherein the HM layer has a thickness of 1.0 nm to 1.8 nm.

20. The memory cell according to claim 1, wherein the HM layer has a thickness of 1.2 nm to 1.7.

21. The memory cell according to claim 1, wherein the coupling layer includes at least one of Ru or Ir.

22. The memory cell according to claim 1, wherein the coupling layer has a thickness of 0.6 nm to 1.0 nm.

23. The memory cell according to claim 1, wherein the coupling layer has a thickness of 0.7 nm to 0.9 nm.

24. The memory cell according to claim 1, wherein the ferromagnetic structure comprises more than one layer and two neighboring layers are not identical.

25. The memory cell according to claim 1, wherein the dusting layer has a spin-diffusion length of more than 5 nm.

26. The memory cell according to claim 25, wherein the dusting layer has a spin-diffusion length of greater than or equal to 55 Å and a Stoner criteria of greater than or equal to 0.57 to less than or equal to 1.0.

27. The memory cell according to claim 26, wherein the dusting layer has a Stoner criteria of greater than or equal to 0.85 to less than or equal to 1.0.

28. The memory cell according to claim 1, wherein the ferromagnetic (FM) material does not comprise Fe or an Fe alloy and the dusting layer consists of a 4d metal.

29. A magnetic domain wall displacement type memory cell according to claim 1, wherein the coupling layer comprises at least one of Ir, W, Ta or Ru and the ferromagnetic (FM) material does not include Fe or Fe alloy.

30. A magnetic domain wall displacement type memory cell according to claim 1 having a remnant magnetization, $M_r$, at a magnetization field of 0 T and a saturation magnetization, $M_s$, at a magnetization field of 1.5 T and $M_r/M_s$ has been tuned to zero.

31. A magnetic domain wall displacement type memory cell comprising a ferromagnetic layer that does not include Fe or Fe alloy, a heavy metal (HM) layer and a dusting layer (DL) consisting of a 4d metal at the ferromagnetic layer/heavy metal layer interface of a ferromagnetic (FM) structure or a synthetic antiferromagnetic (SAF) structure, and a SAF structure with a 0.2 nm thick Pd or Rh dusting layer has a decrease of ~70% in threshold current density, $J_{th}$, in comparison to an otherwise identical structure with no dusting layer.

* * * * *